United States Patent
Marinskiy et al.

(10) Patent No.: US 10,763,179 B2
(45) Date of Patent: Sep. 1, 2020

(54) NON-CONTACT METHOD TO MONITOR AND QUANTIFY EFFECTIVE WORK FUNCTION OF METALS

(71) Applicants: SEMILAB Semiconductor Physics Laboratory Co., Ltd., Budapest (HU); Sung-Li Wang, Hsin-Chu (TW); Lin-Jung Wu, Hsin-Chu (TW); Shyh-Shin Ferng, Hsin-Chu (TW); Yi-Hung Lin, Hsin-Chu (TW); Sheng-Shin Lin, Hsin-Chu (TW)

(72) Inventors: Dmitriy Marinskiy, Tampa, FL (US); Thye Chong Loy, Chubei (TW); Jacek Lagowski, Tampa, FL (US); Sung-Li Wang, Hsin-Chu (TW); Lin-Jung Wu, Hsin-Chu (TW); Shyh-Shin Ferng, Hsin-Chu (TW); Yi-Hung Lin, Hsin-Chu (TW); Sheng-Shin Lin, Hsin-Chu (TW)

(73) Assignee: SEMILAB Semiconductor Physics Laboratory Co., Ltd., Budapest (HU)

( * ) Notice: Subject to any disclaimer, the term of this patent is extended or adjusted under 35 U.S.C. 154(b) by 454 days.

(21) Appl. No.: 15/055,062

(22) Filed: Feb. 26, 2016

(65) Prior Publication Data
US 2016/0252565 A1 Sep. 1, 2016

Related U.S. Application Data

(60) Provisional application No. 62/126,222, filed on Feb. 27, 2015.

(51) Int. Cl.
*G01R 31/02* (2006.01)
*G01R 31/26* (2020.01)
(Continued)

(52) U.S. Cl.
CPC .......... *H01L 22/14* (2013.01); *G01R 31/2621* (2013.01); *G01R 31/2623* (2013.01);
(Continued)

(58) Field of Classification Search
CPC ............ G01R 31/2621; G01R 31/2623; G01R 31/2625; G01R 31/2626; G01R 31/2628; G01N 17/00
(Continued)

(56) References Cited

U.S. PATENT DOCUMENTS 6,097,196 A * 8/2000 Verkuil ............. G01R 31/2648
250/492.2
6,506,676 B2 1/2003 Park et al.
(Continued)

FOREIGN PATENT DOCUMENTS

GB 2439439 12/2007

OTHER PUBLICATIONS

J. S. Kim et al., "Kelvin probe and ultraviolet photoemission measurements of indium tin oxide work function: a comparison," Synthetic Metals, Jun. 2000, 111-112: 311-314.
(Continued)

*Primary Examiner* — Raul J Rios Russo
(74) *Attorney, Agent, or Firm* — Fish & Richardson P.C.

(57) ABSTRACT

An example semiconductor wafer includes a semiconductor layer, a dielectric layer disposed on the semiconductor layer, and a layer of the metal disposed on the dielectric layer. An example method of determining an effective work function of a metal on the semiconductor wafer includes determining a surface barrier voltage of the semiconductor wafer, and determining a metal effective work function of the semiconductor wafer based, at least in part, on the surface barrier voltage.

15 Claims, 9 Drawing Sheets

(51) Int. Cl.
  *H01L 21/66* (2006.01)
  *G01R 31/265* (2006.01)
  *G01R 31/28* (2006.01)
  *G01N 17/00* (2006.01)

(52) U.S. Cl.
  CPC ..... *G01R 31/2625* (2013.01); *G01R 31/2626* (2013.01); *G01R 31/2628* (2013.01); *G01R 31/2656* (2013.01); *G01R 31/2831* (2013.01); *G01N 17/00* (2013.01)

(58) Field of Classification Search
  USPC ......... 324/71, 378, 403, 415, 425, 500, 537, 324/716, 719, 762.01, 762.09; 257/48
  See application file for complete search history.

(56) References Cited

U.S. PATENT DOCUMENTS

| | | | |
|---|---|---|---|
| 7,202,691 B2 | 4/2007 | Lagowski et al. | |
| 8,004,290 B1* | 8/2011 | Zhang | G01R 31/129 324/671 |
| 8,735,302 B2 | 5/2014 | Joshi et al. | |
| 9,390,970 B2* | 7/2016 | Chiang | C23C 14/046 |
| 2002/0090746 A1* | 7/2002 | Xu | G01N 27/002 438/17 |
| 2002/0125900 A1* | 9/2002 | Savtchouk | G01B 7/085 324/750.02 |
| 2002/0130674 A1* | 9/2002 | Lagowski | G01B 7/085 324/750.02 |
| 2005/0274805 A1* | 12/2005 | Ramappa | H01L 22/20 235/462.07 |
| 2006/0211259 A1* | 9/2006 | Maes | C23C 16/401 438/762 |
| 2006/0219658 A1* | 10/2006 | Howland, Jr. | G01R 31/312 216/61 |
| 2006/0267622 A1 | 11/2006 | Lagowski et al. | |
| 2010/0007363 A1* | 1/2010 | Dudman | H01L 22/14 324/715 |
| 2012/0234683 A1* | 9/2012 | Lien | C25D 7/123 205/83 |
| 2014/0210506 A1* | 7/2014 | Wu | H01J 37/32073 324/762.05 |
| 2015/0171218 A1* | 6/2015 | Steigerwald | H01L 29/517 257/365 |
| 2015/0330909 A1* | 11/2015 | Koldiaev | G01N 21/8806 356/237.2 |
| 2016/0035631 A1* | 2/2016 | Lee | H01L 21/28088 438/16 |
| 2016/0155843 A1* | 6/2016 | Steigerwald | H01L 29/4958 257/365 |
| 2016/0372385 A1* | 12/2016 | Kohli | H01L 22/12 |
| 2018/0217193 A1* | 8/2018 | Koldiaev | G01N 21/8806 |

OTHER PUBLICATIONS

Zhu et al., "Observation of Dipole Layer Formed at High-k Dielectrics/SiO2 Interface with X-ray Photoelectron Spectroscopy," Applied Physics Express, May 2010, 3(6).

Marinskiy et al., "New Approach to Surface Voltage Based on non-Visual Defect Inspection," ECS Transactions, Mar. 2014, 60(1): 917-922.

Kronic et al., "Surface photovoltage phenomena: theory, experiment, and application," Surf. Science Reports, 1999, 37: 1-206.

Schaeffer, J. K., "Chapter 5: Metal Gate Electrodes," S. Kar (ed.), *High Permittivity Gate Dielectric Materials*, Springer Series in Advanced Microelectronics 43, pp. 235-262 (2013).

* cited by examiner

NON-CONTACT METHOD TO MONITOR AND QUANTIFY EFFECTIVE WORK FUNCTION OF METALS

CROSS-REFERENCE TO RELATED APPLICATION

This application claims the benefit of U.S. Provisional Application No. 62/126,222, filed Feb. 27, 2015.

TECHNICAL FIELD

This disclosure relates to semiconductor wafer testing, and more particularly to monitoring a metal effective work function.

BACKGROUND

Semiconductor wafers are used in manufacturing integrated circuits (ICs). ICs commonly incorporate a large number of microelectronic metal oxide semiconductor (MOS) devices, such as MOS capacitors and MOS field effect transistors (MOSFETs). In a MOS device, a dielectric material is placed on top of a semiconductor substrate, and metal is placed on the top of the dielectric material to form a metal gate. When a voltage is applied across the device, a conducting channel is induced in the semiconductor substrate via the field effect. This channel can contain electrons (e.g., in an nMOS device), or holes (e.g., in a pMOS device), opposite in type to the substrate. In some cases, a complementary MOS device (CMOS) can be constructed using nMOS and pMOS devices in combination.

Metrology is used to monitor various parameters associated with devices forming integrated circuits and maintain quality of the ICs. Non-contact techniques may be used to monitor some of these parameters.

SUMMARY

A non-contact technique for quantification of metal effective work function (EWF) is described herein.

In general, in an aspect, a method for monitoring metal effective work function, EWF, includes quantifying semiconductor surface barrier, $V_{SB}$ in a structure that includes a semiconductor substrate, a dielectric film on a semiconductor and a metal film formed on dielectric.

Implementations of this aspect may include or more of the following features.

In some implementations, (a) said metal film can include of one or more layers such as one, two, three or more layers of different metals sandwiched on top of the dielectric; (b) said dielectric film can include of one or more layers such as one, two, or more layers of different dielectrics sandwiched on top of semiconductor substrate; and (c) said monitoring metal effective work function can provide quantification of the effective work function of the first metal layer on the top dielectric layer of dielectric film.

In some implementations, the semiconductor surface barrier $V_{SB}$ can be quantified by measurements of surface voltage on metal surface done in the dark, giving $V_{Dark}$ and under illumination with strong light with photon energy larger than the energy gap of the semiconductor substrate, giving $V_{Light}$. The said measurements of surface voltage can be done with noncontact probes, such as a vertically vibrating capacitor probe, i.e. a Kelvin probe, or a laterally vibrating capacitor i.e. Monroe probe, or a stationary capacitor probe moving parallel with respect to the measured surface. The illumination source can be a light emitting diode with the energy larger than the semiconductor substrate energy gap and intensity sufficient to substantially flatten a semiconductor surface barrier. The illumination source can be illuminating a wafer from the front side if the metal film is transparent to the light. The illumination source can illuminate a wafer from the back side, if the front side is opaque to the light.

In some implementations, the illumination from one, two, or more light sources can be delivered via an optical cable.

In some implementations, a measured value of the semiconductor surface barrier $V_{SBmeasured}$ is calculated as a difference $V_{SBmeasured} = V_{Dark} - V_{Light}$, and the said difference can be used as the indicator, $1_{EWF}$, of the metal effective work function in the measured spot based on the proportionality $1_{EwF} = a \cdot V_{SBmeasured}$.

In some implementations, (a) the measurement conditions and the test structure can be optimized to produce the depletion type semiconductor surface barrier and negligible effect of the interface traps and the dielectric voltage, (b) the corrected value of the semiconductor surface barrier can be calculated as $V_{SB} = a (V_{dark} - V_{Light}) + b$ where a and b are the correction parameters depending on measurement condition and on specific structure, and (c) the EWF can be quantified using relation $EWF = \phi_S - qV_{SB}$ where $\phi_S$ is the bulk work function of the semiconductor substrate.

In some implementations, the method can be applied to whole wafer MOS structure, where a wafer map of the semiconductor surface barrier is measured utilizing the following sequence: first the Kelvin probe surface voltage map can be measured for the entire wafer in the dark; second, the Kelvin probe surface voltage can be measured for the entire wafer under illumination; third, the map of semiconductor wafer surface barrier can be calculated from the difference between the maps measured in steps one and two; and fourth, the map of the indicator $I_{EWF}$ can be calculated according to a technique described above.

In some implementations, the surface voltage can be measured with Kelvin force microscopy method using micro-probe such as probe 20 µm diameter, 10 µm diameter probe or smaller.

In some implementations, the method can be used for testing the metal effective work function in miniature test areas with metal-dielectric-semiconductor test structures such as 100 µm×100 µm or smaller, the method including of the following steps: 1. place the wafer with test areas on measurement chuck; 2. find an alignment mark and positioning a designated test area under the Kelvin force probe; 3. measure the surface voltage in the dark, $V_{Dark}$ and under illumination, $V_{Light}$, with the Kelvin force probe; 4. calculate the as measured semiconductor surface barrier $V_{SBmeasured} = V_{Dark} - V_{Light}$ and corresponding effective work function indicator for the designated test area $I_{EwF} = a \cdot V_{SBmeasured}$. If measurements are done under optimum condition further EWF quantification steps can be included: 5. calculate corrected semiconductor surface barrier $V_{SB} = a (V_{dark} - V_{Light}) + b$; 6. calculate metal work function using $EWF = \phi_S - qV_{SB}$; 7. proceed to the next test site.

In some implementations, the p-type semiconductor substrate can be used to monitor metal with low effective work function i.e. EWF that is lower than the work function of the semiconductor substrate.

In some implementations, the doping of said p-type semiconductor substrate can be such that a depletion type surface barrier is induced by said metal.

In some implementations, n-type semiconductor substrate can be used to monitor metal with high effective work function i.e. EWF that is higher than the work function of the semiconductor substrate. The doping of said n-type semiconductor substrate can be such that a depletion type surface barrier is induced by said metal.

In some implementations, the thickness of dielectric films can be small enough to assure insignificant metal induced voltage drop across the dielectric.

In some implementations, the dielectric film can be optimized to obtain low interface trap charge $Q_{it}$ at interface dielectric-semiconductor substrate, such as $Q_{it}$ in low $10^{12}$, $10^{11}$, $10^{10}$, or less.

In some implementations, the semiconductor surface barrier can be quantified by contacting a site with a conductive probe and measuring corresponding open circuit voltage under illumination with strong light.

In general, in another aspect, a method of determining an effective work function of a metal on a semiconductor wafer includes the follow steps, where the semiconductor wafer includes a semiconductor layer, a dielectric layer disposed on the semiconductor layer, and a layer of the metal disposed on the dielectric layer: determining a surface barrier voltage of the semiconductor wafer, and determining a metal effective work function of the semiconductor wafer based, at least in part, on the surface barrier voltage.

Implementations of this aspect may include or more of the following features.

In some implementations, determining the surface barrier voltage of the semiconductor wafer can include measuring a first surface voltage of the metal layer while the metal layer is illuminated, and measuring a second surface voltage of the metal layer while the metal layer is not illuminated. The surface barrier voltage can correspond to the second surface voltage minus the first surface voltage. The first and second surface voltages can be measured using a Kelvin probe. The first and second surface voltages can be measured using a capacitor probe. Measuring a first surface voltage of the metal layer while the metal layer is illuminated can include illuminating the metal layer with photon energy larger than an energy gap of the semiconductor layer. The metal film can be transparent to the illumination, and measuring a first surface voltage of the metal layer while the metal layer is illuminated can include directing illumination upon the metal layer of the wafer. The metal film can be opaque to the illumination, and measuring a first surface voltage of the metal layer while the metal layer is illuminated can include directing illumination upon the substrate layer of the wafer.

In some implementations, the surface barrier voltage can be proportional of the metal effective work function.

In some implementations, the metal effective work function of the semiconductor wafer can be determined, based at least in part, on a bulk work function of the semiconductor layer. The metal effective work function can be determined using the relationship $EWF=\Phi_S-qV_{SB}$, where EWF is the metal effective work function, $\Phi_S$ is the bulk work function of the semiconductor layer, $V_{SB}$ is the surface barrier voltage of the wafer, and q is a charge of an electron.

In some implementations, determining the surface barrier voltage of the semiconductor wafer can include determining a spatially dependent map of the surface barrier voltage along a surface of the semiconductor wafer. Determining a metal effective work function of the semiconductor wafer can be based, at least in part, on the spatially dependent map.

In general, in another aspect, a system includes a probe for determining a surface barrier voltage of a semiconductor wafer, the semiconductor wafer including a substrate layer, a dielectric layer, and a metal layer. The system also includes one or more processors, and non-transitory memory. The non-transitory memory stores instructions, which, when executed by the one or more processors, causes the one or more processors to determine a metal effective work function of the semiconductor wafer based, at least in part, on the surface barrier voltage.

Among other advantages, implementations described herein may provide a fast and effective method of monitoring metal EWF, and can benefit IC fabrication by shortening the metal gate development cycle, improving performance control, and providing higher manufacturing yield. Further, the EWF value of the metal gate can be monitored using a non-contact technique, such that measurements can be made on product wafers without contaminating the devices. As a result, product wafers can be returned to the IC fabrication line for further processing. Implementations of these techniques also provide fast data feedback that can accelerate the metal gate development cycle and improve metal EWF control in IC fabrication.

The details of one or more embodiments are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 2:
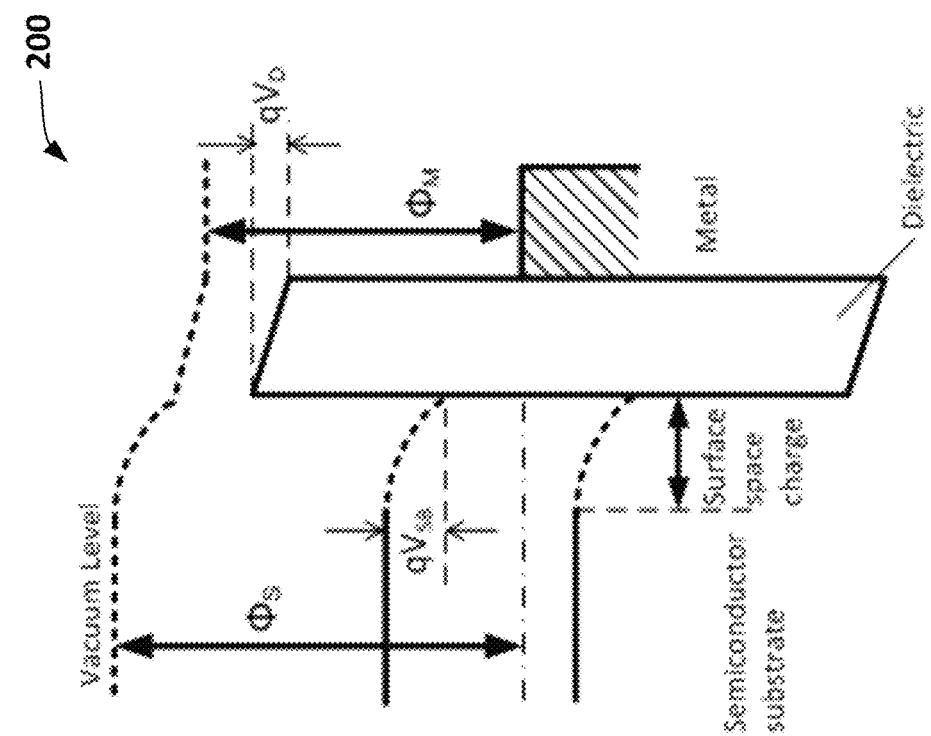
FIG. 2 shows an equilibrium energy band diagram for a p-type silicon substrate, dielectric, n-type metal. The semiconductor surface barrier, $V_{SB}$, is shown.

Implementations for monitoring a metal effective work function of a MOS structure are described herein.

The operational characteristics of a MOS device depend on the work function of its metal gate with respect to the work function of its semiconductor substrate. The work function of a solid is the minimum energy required for an electron to escape from the solid to the vacuum, where the electron energy in a solid is the Fermi energy inside the solid.

As the work function of the metal gate is dependent on its composition, during IC design, the composition of the metal gate can be selected to obtain desired operational characteristics for the device. However, mere knowledge of a metal's work function in vacuum (commonly referred to as the bulk work function) is often insufficient. Instead, when designing a gate, it is often important to determine the metal's work function specifically at the metal-dielectric interface. This work function is referred to as the metal effective work function (EWF). The metal EWF of a device depends on the specific metal and dielectric material used in the device, and the interaction between these materials during device fabrication.

In many cases, a MOS device is designed to have specific metal EWF values in order to achieve low threshold voltages while using high permittivity (i.e., "high-k") dielectrics that reduce leakage. For example, for silicon CMOS devices, a metal EWF of approximately 4.2 eV is often preferable for the nMOS portion of the device, while a metal EWF of approximately 4.8 eV is often preferable for the pMOS portion of the device.

However, the metal EWF of a device is often difficult to control. For example, consider tungsten metal film, which is often used as a metal gate material. The bulk work function of tungsten (i.e., the work function of tungsten in vacuum) is approximately 4.6 eV. However, when tungsten is placed in contact with $HfO_2$ (a high-k dielectric material), the EWF of tungsten at the interface with $HfO_2$ is approximately 4.8 eV. Further, when tungsten is placed in contact with $La_2O_3$ (another high-k dielectric material), the EWF of tungsten at the interface with $La_2O_3$ is approximately 4.46 eV. As another example, titanium nitride aluminum gate films can also exhibit significant EWF sensitivity not only to the dielectric material, but also to the dielectric deposition process, the metal deposition process, and post deposition annealing process.

As deviation of the metal EWF from its intended specifications, in many cases, can alter the performance of a device and negatively impact the manufacturing yield of an integrated circuit, the metal EWF of the device should be monitored during semiconductor device development and IC device fabrication to ensure that the desired metal EWF is obtained. Accordingly, a fast and effective method of monitoring a metal EWF can benefit IC fabrication by shortening the metal gate development cycle, improving performance control, and providing higher manufacturing yield.

This disclosure describes various implementations for monitoring the metal EWF of a MOS structure. In some implementations, a metal EWF value can be determined for a semiconductor wafer sample having a MOS-type structure that includes a semiconductor substrate, a dielectric on the top of the semiconductor, and a metal on the top of the dielectric. The metal can include multiple layers of different metals and the dielectric can include a stack of different dielectric materials.

In some implementations, the metal EWF can be determined based, at least in part, by determining $V_{SB}$, the semiconductor surface space charge potential barrier at the semiconductor-dielectric interface (commonly referred to as the surface barrier or the surface barrier voltage). The measured $V_{SB}$ value can be used as an indicator for the metal EWF (e.g., a metric that relates either indirectly or directly to the metal EWF), and can provide a means for mapping distribution of the metal EWF on a semiconductor wafer. In some cases, the $V_{SB}$ can also be used to quantify the actual metal EWF of given metal layer and given dielectric layer.

In some cases, the EWF value can be monitored using a non-contact technique, such that measurements of test structures can be made without contaminating the wafer. As a result, the wafer can be returned to the IC fabrication line for further processing. Implementations of these techniques also provide fast data feedback that can accelerate the metal gate development cycle and improve metal EWF control in IC fabrication.

In general, in a MOS capacitor, the semiconductor surface barrier $V_{SB}$ develops due to the work function difference $\Phi_{MS}$ between the metal and a semiconductor. In the fundamental process of equalizing the Fermi energy, electrons are transferred from the lower work function material to the higher work function material. For example, in some cases, the metal has work function $\Phi_M$ smaller than the work function of the p-type semiconductor $\Phi_S$. At equilibrium, this results in a negatively charged surface space charge region with a positive surface potential barrier $qV_{SB}$ and corresponding bands bending downward (e.g., depletion or inversion). This is a consequence of negative $\Phi_{MS}=\Phi_M-\Phi_S$, i.e., when the gate metal work function is smaller than the work function of the semiconductor.

When $\Phi_{MS}=0$, there is no charge transfer between metal and semiconductor; thus, $V_{SB}=0$ and the energy bands are flat at the interface. This would correspond to a flat-band condition without any biasing of the MOS capacitor. When $\Phi_{MS}>0$, a positively charged space charge develops in the semiconductor with negative surface barrier $qV_{SB}<0$, and the bands bend upwards. For p-type semiconductor substrate this would correspond to accumulation.

The work function difference between the metal and the semiconductor has an effect not only on $V_{SB}$, but also on the dielectric voltage, $V_D$ (in a MOS capacitor, $V_D$ is the potential drop across the dielectric). Considering this effect, the potential distribution in MOS capacitor becomes $\Phi_{MS}=-qV_{SB}-qV_D$. For a thick dielectric, $qV_D$ can be large and it can dominate, thus reducing the surface barrier sensitivity to metal work function changes. However, $qV_D$ decreases with increasing the dielectric capacitance, i.e., decreasing the dielectric thickness and increasing the dielectric constant. Therefore, in some cases, it may be preferable to use a test structure with sufficiently thin dielectric films, such as gate dielectrics with an equivalent oxide thickness, EOT, of about 2 nm or less.

In some cases, the sensitivity of the surface barrier to metal work function can be additionally optimized by proper selection of the semiconductor substrate regarding doping type and doping level. These two semiconductor parameters provide a means to adjust the semiconductor work function $\Phi_S$ value. For Si, the value of $\Phi_S$ can be tuned from a low limit of approximately 4.1 eV (provided by the electron affinity $\chi_S=4.05$ eV in highly doped n-type Si) up to a high limit of approximately 5.2 eV for strongly doped p-type Si (where limit is provided by $\chi_S+(E_C-E_V)$). The MOS potential distribution equation for a thin dielectric and negligible $qV_D$ gives the relationship $\Phi_S-\Phi_M=-qV_{SB}$. Thus, the surface barrier can be optimized for testing a metal with a given effective work function value $\Phi_M$ by selecting semiconductor substrate with appropriate $\Phi_S$. To achieve a depletion surface barrier, $qV_{SB}$ can be positive in p-Si and negative in n-Si.

The metal effective work function quantifies the metal work function value at the metal-dielectric interface (e.g., at a $TiN/HfO_2$ interface). EWF depends on the metal, dielectric, and interaction between them, and as such requires stringent control during MOS and MOSFET device fabrication. In this disclosure, we propose to use the semiconductor substrate surface barrier, $V_{SB}$, to monitor and quantify the metal effective work function. In some implementations, $V_{SB}$ is quantified by measuring the surface voltage of the device with a non-contact voltage probe in the dark and under illumination.

Figure 1:
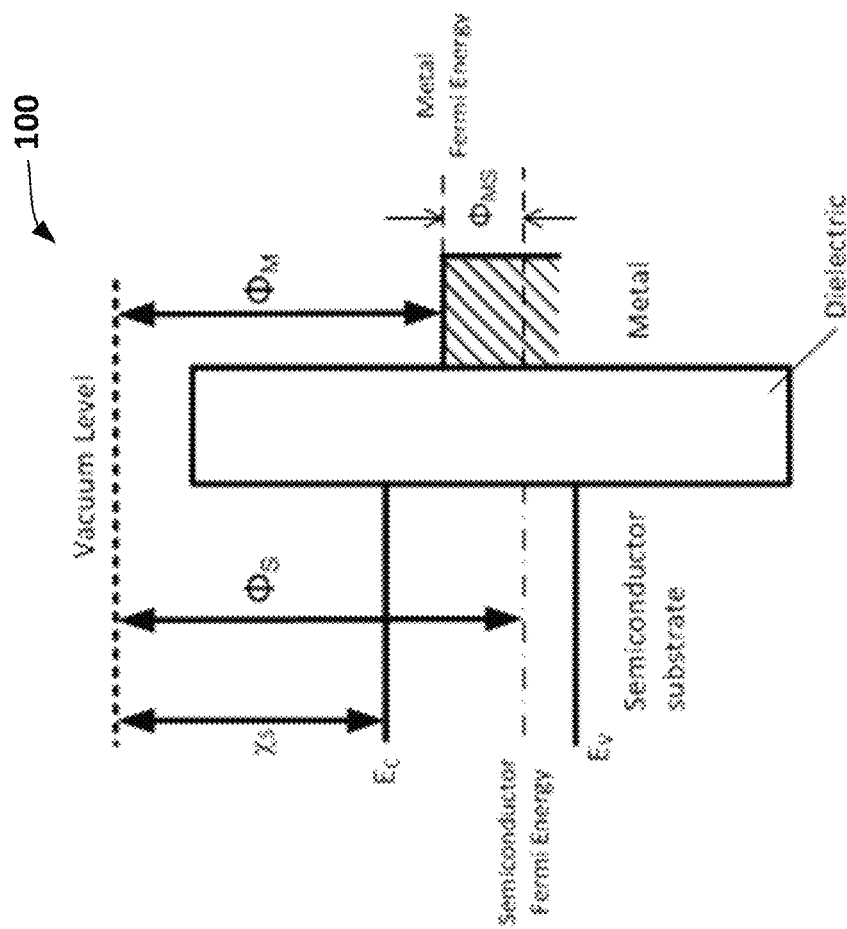
FIG. 1 shows an energy band diagram for a p-type silicon substrate, dielectric, n-type metal before equilibration.

FIG. 1 shows an energy band diagram 100 for an example MOS capacitor before equilibrium, and FIG. 2 shows an energy band diagram 200 for the MOS capacitor after equilibrium. The semiconductor surface barrier, $V_{SB}$, is shown in FIG. 2. The silicon substrate work function is $\Phi_S$, and the metal work function is $\Phi_M$. As shown in FIG. 2, at an equilibrium condition, the Fermi level equalizes in the semiconductor and in the metal. As a result, the semiconductor surface barrier, $V_{SB}$, develops in equilibrium. $V_{SB}$ depends on the metal EWF, and as such, can be used for monitoring the metal EWF. In ideal conditions (e.g., with thin dielectric and negligible dielectric voltage $V_D$), the metal EWF is quantified using pertinent energy relationships: $\Phi_M = \Phi_S - qV_{SB}$. For a p-type silicon substrate, $\Phi_S = \chi_{Si} + (E_C - E_F)$, where $\chi_{Si}$ is the electron affinity, and $E_C - E_F = E_g - kT \ln(N_V/N_A)$, where $E_F$ is the Fermi level position, kT is the thermal voltage, $N_V$ is the density of states in the valence band, and $N_A$ is the doping concentration (acceptors for p-type substrate).

Figure 3:
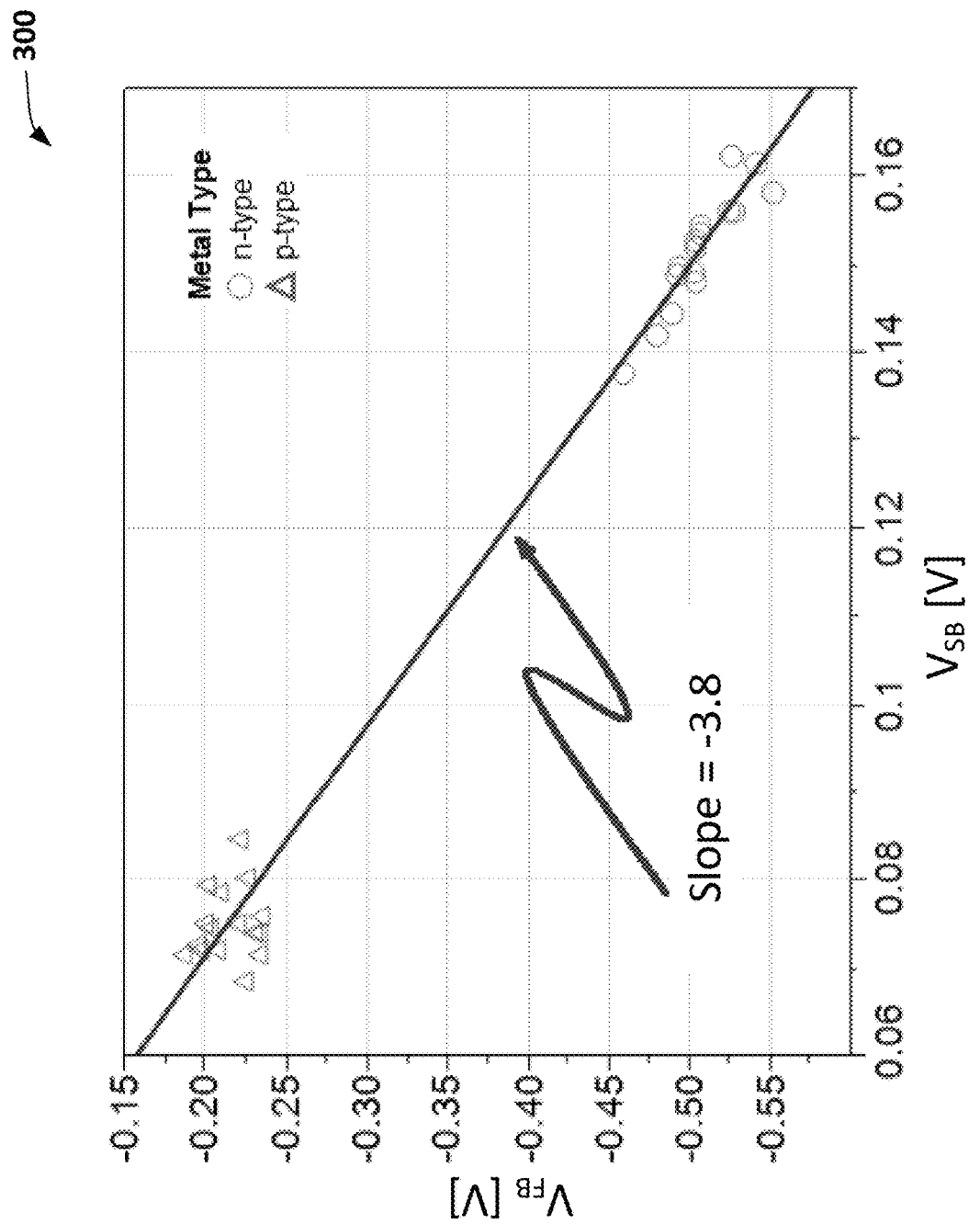
FIG. 3 shows a correlation plot between flat band voltage, $V_{FB}$, and the as measured surface barrier, $V_{SB}$.

In many practical cases, the measured $V_{SB}$ value can be used as an indicator of the metal EWF and a convenient monitoring parameter for metal EWF control. That is, since the metal EWF is related, at least in part, to $V_{SB}$, $V_{SB}$ can be used as a measurable metric that indirectly provides information regarding the metal EWF. For example, FIG. 3 shows a scatter plot 300 illustrating the correlation between a measured $V_{SB}$ and a measured $V_{FB}$, where $V_{FB}$ is the flat-band voltage. $V_{FB}$ is often used for monitoring the work function difference $\Phi_{MS}$ between metal gate and the semiconductor substrate. For example, in some cases, the flat-band voltage can be measured for one dielectric thickness, and $\Phi_{MS}$ can be deduced from the simplified relationship $V_{FB} = \Phi_{MS} -$ $$\frac{(Q_{it} + Q_f)}{C_{ox}},$$

where $Q_{it}$ and $Q_f$ is the interface trapped charge and fixed charge, respectively, and $C_{ox}$ is the oxide (dielectric) capacitance. The measured $V_{FB}$ value is affected by the metal EWF and by charges at the semiconductor-dielectric interface, as well as by charges in the dielectric and any dipole layers present in the structure (e.g., a dipole at the oxide interlayer/high-k dielectric interface). Thus, as $V_{FB}$ depends, at least in part, on the metal EWF, it can be used as an indicator for the metal EWF. However, measuring $V_{FB}$ during IC fabrication is often difficult (e.g., as it commonly entails a lengthy processing of preparing a terraced test wafer structure). Thus, instead of measuring $V_{FB}$, $V_{SB}$ can instead be measured, and $V_{SB}$ can be used as an indicator for the metal EWF. Therefore, in some cases, the indicator of the metal EWF can be expressed as $I_{EWF} = \alpha \cdot V_{SBmeasured}$, where $\alpha$ is an empirical constant. As shown in FIG. 3, in this example, the empirical constant of linear fit between $V_{FB}$ and $V_{SB}$ is equal to approximately $-3.8$. However, other constants can also be used, depending on the implementation. As an example, in the case of very thin dielectric, low interface charge, and monitoring on small test site, one may achieve $\Delta V_{FB} \approx \Delta V_{SB}$.

The use of the measured $V_{SB}$ as an indicator of the effective work function may be useful in a variety of applications. For example, this may be particularly useful when: 1) an experiment underestimates the $V_{SB}$ due to difficulty in achieving flat-band under illumination, 2) the interface charge and the dielectric voltage contribution cause the metal induced surface barrier to be lower than the ideal metal semiconductor work function difference, 3) the semiconductor work function $\Phi_S$ is not exactly known, and 4) total metalized area is larger than the $V_{DARK} - V_{LIGHT}$ measurement area (e.g., in the case of full wafer mapping). The last case may be particularly important for metal gate development, since it includes a full wafer MOS structure, i.e. a blanket wafer structure. Other techniques, such as $V_{FB}$ measurements, are often not possible on such structures. Therefore, method of using the measured $V_{SB}$ is, in some cases, the only method to quantify metal EWF on such structure and as such can be very useful for metal gate development.

Figure 4:
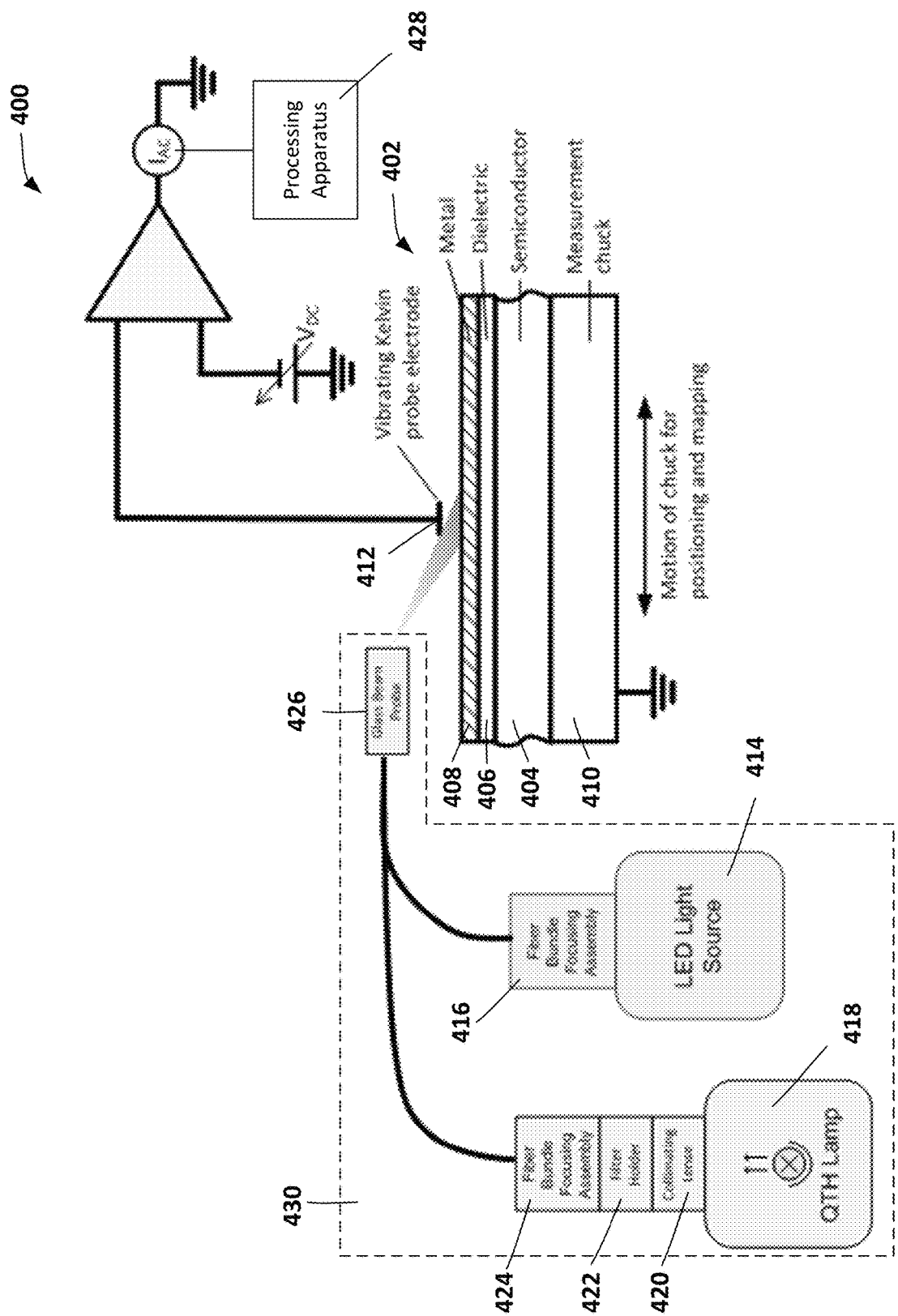
FIG. 4 shows an example system for monitoring the metal EWF.

FIG. 4 shows a schematic of an example system 400 for monitoring the metal EWF. The system 400 includes a measurement chuck 410, a Kelvin probe 412, an illumination assembly 430, and a processing apparatus 428.

The semiconductor wafer 402 includes a semiconductor layer 404, a dielectric layer 406, and a metal layer 408 on the entire wafer 402 or on a test area larger than the Kelvin probe 412 (e.g., a "macro" test area). The semiconductor wafer 402 is placed on a measurement chuck 410, which provides a grounded medium for supporting the semiconductor wafer 402. The measurement chuck 410 can also move to position the semiconductor wafer 402 beneath the Kelvin probe 412 (e.g., using a moveable stage) and in position to receive illumination from illumination assembly 430.

The Kelvin probe 412 is positioned at a working distance above the wafer surface (e.g., 50-250 μm). The diameter of the Kelvin probe 412 can vary, depending on the application. For example, in some cases, the Kelvin probe 412 can have a diameter of approximately 2.0 mm, 1.0 mm, 0.5 mm any other diameter. In some cases, a relatively large probe diameter can allow the probe to obtain a surface voltage map for a relatively large portion of the semiconductor wafer 402 (e.g., most or all of the semiconductor wafer 402) in a shorter period of time. In some cases, measurement can be facilitated by an appropriate moveable stage. For example, in some cases, a moveable translation and/or rotation stage can be used to translate and/or rotate the semiconductor wafer 402 beneath the Kelvin probe 412 (e.g., along two translational degrees of freedom, such as along x and y dimensions, or one translational degree of freedom and a rotational degree of freedom, such as along x and θ dimensions). As an example, in some implementations, a measurement time for a 300 mm diameter wafer, given a 2 mm diameter Kelvin probe and a 5 ms probe response time, can be less than 4 minutes. Therefore, in some cases, the total measurement time to acquire surface voltage in the dark and under illumination can be less than 8 minutes.

The illumination assembly 430 includes at least one source of illumination. In the example shown in FIG. 4, the illumination assembly includes an LED light source 414 and a quartz tungsten halogen (QTH) lamp 418. The assembly delivers illumination from either source to the wafer 402 via a glass beam probe 426. The illumination assembly 430 also includes a first fiber bundle focusing assembly 416 to deliver light from LED light source 414 to glass beam probe 426, and also includes a collimating lens 420, a filter holder 422, and a second fiber bundle focusing assembly 424 to deliver illumination from lamp 418 to the glass beam probe 426. Although two sources of illumination are shown in FIG. 4, a single source of illumination or more than two sources of illumination (e.g., three, four, five, or more) are also possible, depending on the implementation.

During operation, the illumination assembly 430 delivers illumination from LED light source 414 to wafer 402 at a position near the Kelvin probe 412. $V_{SB}$ can be calculated from the difference between surface voltages measured by the Kelvin probe 412 in the dark $V_{DARK}$ and under illumination $V_{LIGHT}$, where $V_{SB}=V_{DARK}-V_{LIGHT}$. The light from the LED 414 is intended to collapse surface potential near the semiconductor surface, causing $V_{SB}$ to be approximately equal to zero. In some cases, LED 414 emits photons having an energy larger than the energy gap of the semiconductor substrate 404 of the wafer 402.

In the example shown in FIG. 4, the system 400 includes a green LED 414 emitting light with a wavelength of 0.55 μm, e.g., 2.5 eV photon energy, which may be suitable for a silicon wafer with a 1.1 eV energy gap. However, although an LED 414 is shown in FIG. 4, in some implementations, illumination can be provided by other illumination sources.

Other techniques of quantifying the semiconductor surface barrier can also be used. For instances, in some implementations, the semiconductor surface barrier can be quantified using the techniques discussed in L Kronic and Y. Shapira, Surface photovoltage phenomena: theory, experiment, and application Surf. Science Reports 37 (1999), 1-206.

In some cases, however, the Kelvin probe configuration shown in FIG. 4 may be advantageous, as it provides an absolute measurement of the surface voltage. Therefore, this configuration can be used to measure $V_{SB}$, as well as the flat band voltage that is determined from the $V_{CPD}$ value corresponding to $V_{SB}=0$. In some cases, a capacitor probe can be used instead of or in addition to a Kelvin probe. For example, in some implementations, a capacitor probe can be moved laterally, parallel to the surface of the wafer 402. A Monroe probe with vibration parallel to the surface of the wafer 402 can also be used, either instead of or in addition to a Kelvin probe or capacitor probe.

The processing apparatus 428 is communicatively coupled of the Kelvin probe 412, and calculates the metal EWF of the wafer 402 based on the measurements obtained by the Kelvin probe 412. For example, as described herein, the processing apparatus 428 can determine either an indicator for the metal EWF (e.g., a metric that indirectly provides information regarding the metal EWF) and/or the actual metal EWF. The processing apparatus 428 can also control the operation of one or more components of the system 400. For example, in some cases, the processing module controls the LED 414 (e.g., by transmitting command that switch the LED 414 on or off), the measurement chuck 410 (e.g., by controlling the movement of the movement chuck 410) and the Kelvin probe 412 (e.g., by controlling when the Kelvin probe 412 obtains measurements and controlling the movement of the Kelvin probe 412).

Figure 5:
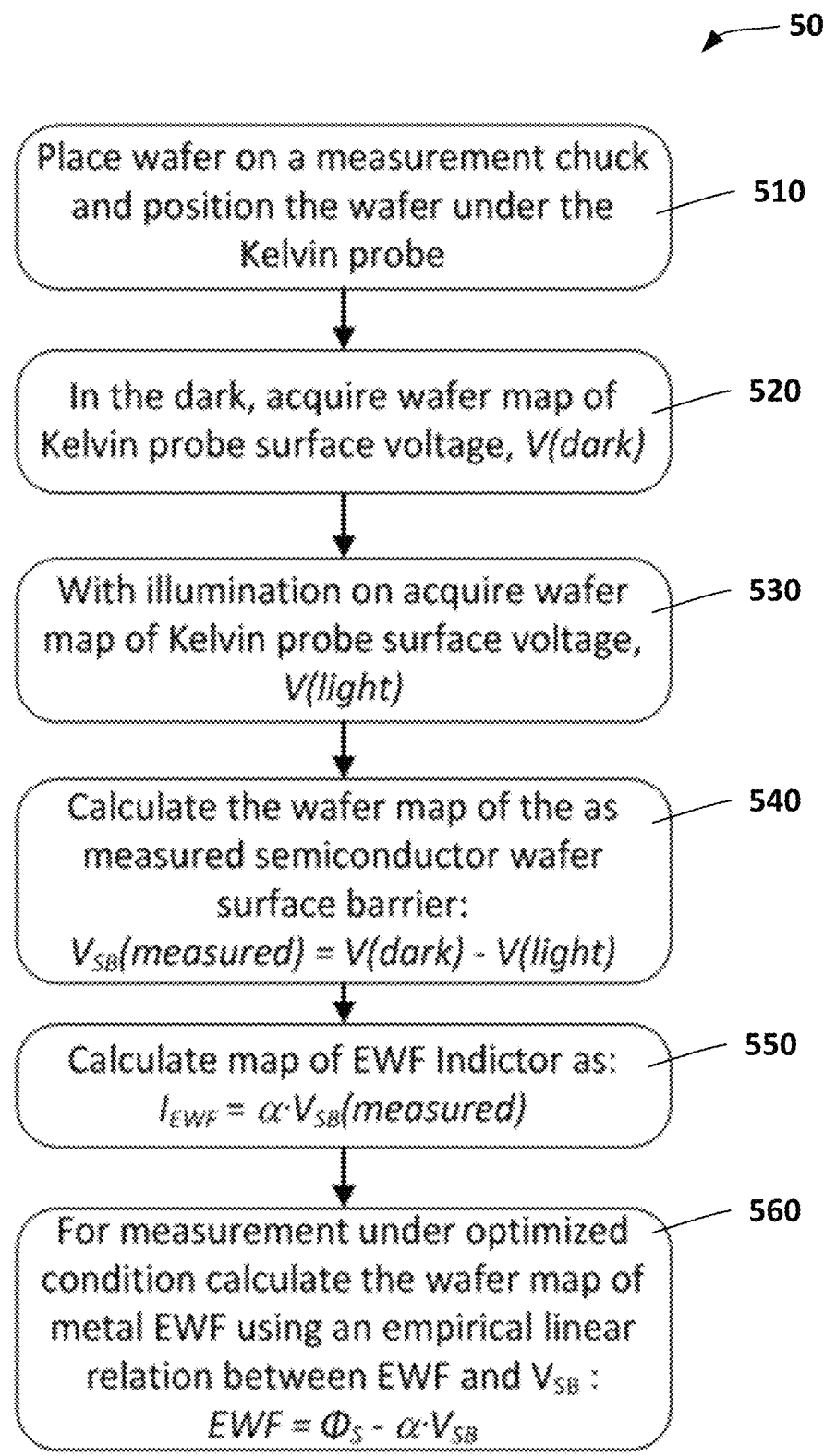
FIG. 5 shows an example process of mapping the metal EWF.

FIG. 5 shows an example process 500 of mapping the metal EWF.

The process 500 begins by placing the wafer on a measurement chuck and positioning the wafer under the Kelvin probe (step 510). For example, when using the system 400, a wafer is placed on the measurement chuck 410.

A distance sensor can be used to determine the distance between the Kelvin probe and the wafer prior to and during scanning, such that the Kelvin probe is properly positioned relative to the wafer. In some cases, the Kelvin probe height is positioned at the initial point of scanning above the wafer. The scan is performed by moving the wafer with respect to the probe (e.g., using the moveable stage).

After the wafer is positioned under the Kelvin probe, a wafer map of the wafer's surface voltage is determined while the wafer is in the dark (step 520). A wafer map can be determined for the entire wafer, or for a limited portion of the wafer (e.g., a particular region or area of interest on the wafer). For example, when using the system 400, the wafer map can be determined using the Kelvin probe 412 while the LED 414 is switched off.

The measured wafer map is stored as $V_{DARK}$. In some cases, the wafer map $V_{DARK}$ is a spatially-dependent voltage map of the wafer, and describes the voltage of the wafer at each of several regular positions along the wafer. The wafer map $V_{DARK}$ can be determined using a processing apparatus connected to the Kelvin probe, for example processing apparatus 428.

After the wafer map of the wafer's surface voltage is determined while the wafer is in the dark, a wafer map of the wafer's surface voltage is determined while the wafer is in illuminated (step 530). This wafer map can be determined for the entire wafer, or for a limited portion of the wafer (e.g., a particular region or area of interest on the wafer). For example, when using the system 400, the wafer map is determined using the Kelvin probe 412 while the LED 414 is switched on.

The measured wafer map is stored as $V_{LIGHT}$. In some cases, the wafer map $V_{LIGHT}$ is a spatially-dependent voltage map of the wafer, and describes the voltage of the wafer at each of several regular positions along the wafer. In some cases, the wafer map $V_{LIGHT}$ is determined using a processing apparatus, for example the processing apparatus 428.

After a wafer map of the wafer's surface voltage is determined while the wafer is in illuminated, the measured semiconductor wafer surface barrier $V_{SB}$ is calculated (step 540). The surface barrier $V_{SB}$ is calculated from the difference between the two maps $V_{DARK}$ and $V_{LIGHT}$ (e.g., $V_{SB}=V_{DARK}-V_{LIGHT}$). In some cases, determining the surface barrier $V_{SB}$ includes calculating a spatially-dependent map of the wafer's $V_{SB}$ by determining the difference between the two scanned maps for $V_{DARK}$ and $V_{LIGHT}$ at each of several regular positions along the wafer. In some cases, the wafer's $V_{SB}$ is determined using a processing apparatus, for example the processing apparatus 428 shown in FIG. 4.

After calculating the measured semiconductor wafer surface barrier $V_{SB}$, an indicator for the metal EWF of the wafer is calculated (step 550). As described above, an indicator for the metal EWF can be a value that relates either indirectly or directly to the metal EWF, and provides information regarding the metal EWF. As described above, the indicator of the metal EWF can be expressed as $I_{EWF}=\alpha \cdot V_{SB}$, where $I_{EWF}$ is the indicator of the metal EWF and α is an empirical constant. In some cases, the empirical constant α is determined experimentally, for example by conducting experiments to compare the measured $V_{SB}$ for a test wafer against the measured $V_{FB}$ for the test wafer. As an example, the empirical constant α can be a slope value of linear fit between $V_{FB}$ and $V_{SB}$. As noted above, in some implementations, the slope value of linear fit between $V_{FB}$ and $V_{SB}$ is equal to approximately −3.8. As another example, in the case of very thin dielectric, low interface charge, and monitoring on small test site, $\Delta V_{FB} \sim \Delta V_{SB}$. Other constants can also be used, depending on the implementation.

In some cases, determining the indicator of the wafer's $I_{EWF}$ includes calculating a spatially-dependent map of the wafer's $I_{EWF}$ using the spatially-dependent map of $V_{SB}$, where the map describes the values of $I_{EWF}$ at each of several regular positions along the wafer. In some cases, the wafer's $I_{EWF}$ can be determined using a processing apparatus, for example the processing apparatus 428.

In some cases, the actual metal EWF is calculated for the wafer (step 560). The actual metal EWF can be calculated either instead of or in addition to calculating the indicator of the metal EWF. In some cases, the metal EWF is calculated based on the relationship $EWF=\Phi_S-\alpha V_{SB}$, where EWF is the metal EWF a an empirically determined constant, and $\Phi_S$ is the bulk work function of the semiconductor substrate.

In some cases, when calculating the actual metal EWF, the following relationship is used for $V_{SB}$: $V_{SB}=a(V_{dark}-V_{Light})+b$, where a and b are correction parameters. a and b can be determined empirically, for example by conducting experiments using a variety of measurement conditions and structures, and determining values for a and b that result in an accurate metal EWF under those experimental conditions.

In some cases, determining the indicator of the wafer's metal EWF includes calculating a spatially-dependent map of the wafer's metal EWF using the spatially-dependent maps of $V_{SB}$ and/or $\Phi_S$, where the map describes the values of EWF at each of several regular positions along the wafer. In some cases, the metal EWF is determined using a processing apparatus, for example the processing apparatus 428 shown in FIG. 4.

Although process 500 indicates that a first wafer map is acquired when the wafer is dark, and a second wafer map is acquired when the wafer is illuminated, wafer maps need not be acquired in this order. For example, in some cases, a first wafer map is acquired when the wafer is illuminated, and a second wafer map is acquired when the wafer is dark.

Figure 6:
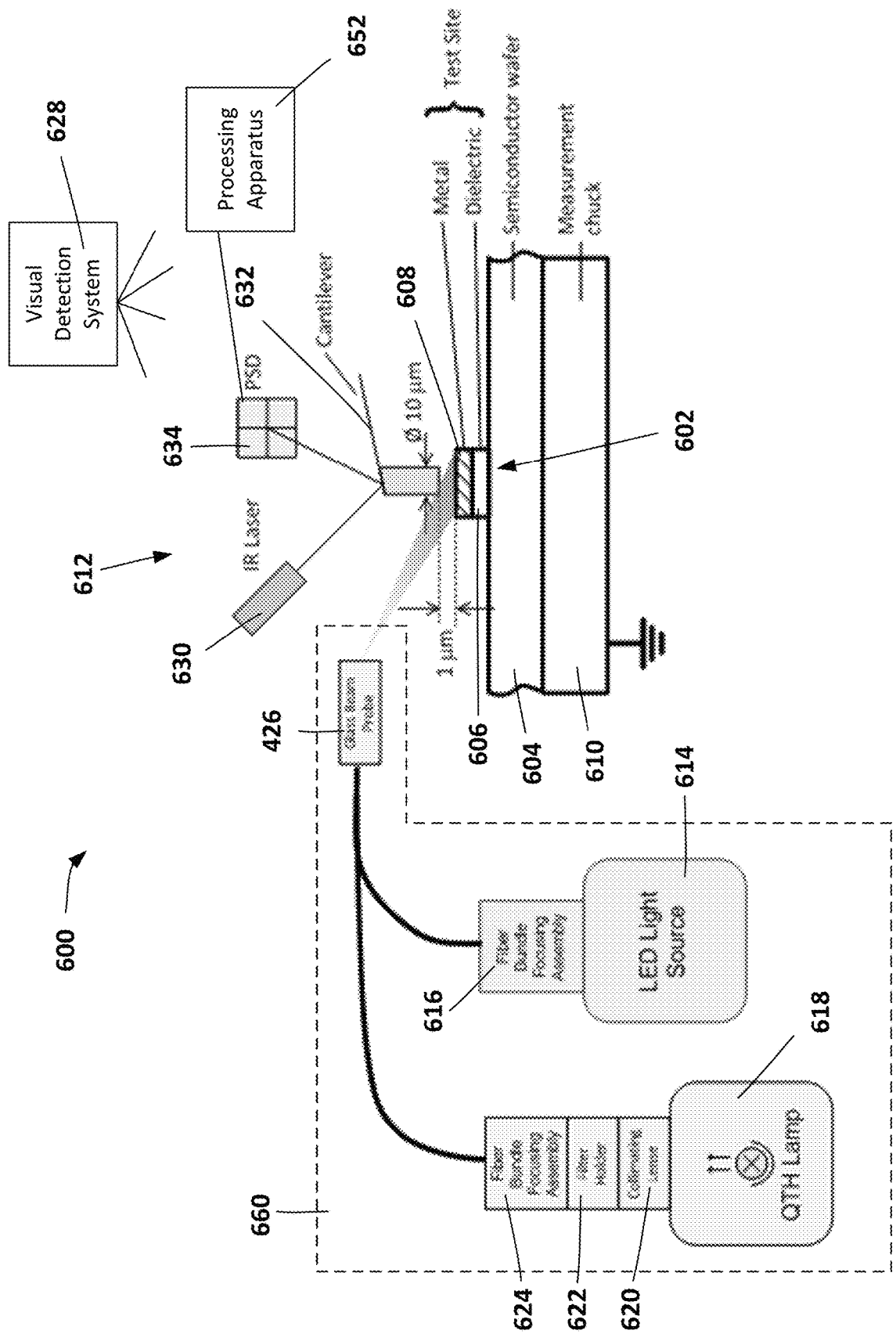
FIG. 6 shows an example system for monitoring the metal EWF on miniature test sites of a pattern semiconductor wafer.

Some implementations can be used to determine the metal EWF on a test site of a patterned wafer which contains miniature test areas. For example, FIG. 6 shows a schematic of an example system 600 for monitoring the metal EWF using a test site 602 on a patterned semiconductor wafer 604. The system 600 includes a measurement chuck 610, a Kelvin Force microscopy probe 612, an illumination assembly 660, a visual detection system 628, and a processing apparatus 652.

The semiconductor wafer 604 contains a test site 602 with a dielectric layer 606, and a metal layer 608, where the dielectric layer 606 and metal layer 608 are present on only a particular portion of the semiconductor 604, serving as a substrate for corresponding MOS structure of the test site.

The semiconductor wafer 604 is placed on a measurement chuck 610, which moves to position test site 602 beneath the Kelvin Force probe 612 (e.g., through a moveable stage) and in position to receive illumination from illumination assembly 660.

The vision system 628 recognizes the test site 602 (e.g., by identifying one or more identifying marks or features on the wafer 604, such as an alignment mark or feature), and determines the location of the test site 602 on the wafer 604 (e.g., by determining coordinates of the test site 602 on a wafer coordinate system). The moveable stage positions the test site 602 under the Kelvin force probe 612.

The surface voltage is measured in a non-contact manner on the test site 602 using a vibrating Kelvin force probe technique. In the example shown in FIG. 6, the Kelvin probe 612 includes an IR laser 630, a cantilever 632, and a position sensitive detector (PSD) 634. The IR laser projects a laser beam onto the cantilever 632, which reflects the laser beam into the PSD 634. The PSD 634 generates a signal proportional to the amplitude of the vibration of the cantilever. The surface voltage V signal is determined based on the PSD signal versus the DC bias applied to the probe. An example implementation of the Kelvin force probe 612 is further described by J. Lagowski et. al (U.S. Pat. No. 7,202,691 B2) and in P. Edelman et. al. Non contact Charge Voltage Method for Dielectric Characterization on Small Test Areas of IC Production Wafers Materials Science in Semiconductor Processing, 9, (2006), 252.

Although FIG. 6 shows only a single test site 602, the wafer 604 can include multiple test sites. Accordingly, in some cases, the surface voltage is measured in the dark and under illumination for each test site before proceeding to the next site. Illumination is delivered by a light emitting diode (LED) 614 positioned near the Kelvin force probe 612. As above, $V_{SB}$ can be calculated from the difference between surface voltages measured in the dark $V_{DARK}$ and under illumination $V_{LIGHT}$, where $V_{SB}=V_{DARK}-V_{LIGHT}$.

As above, the light from the LED 614 is intended to collapse surface potential near the semiconductor surface, causing $V_{SB}$ to be approximately equal to zero. In some cases, LED 614 emits photons having an energy larger than the energy gap of the semiconductor substrate 604.

In the example shown in FIG. 6, the system 600 includes a green LED 614 emitting light with a wavelength of 0.55 μm, e.g., photon energy 2.5 eV, which may be suitable for a silicon wafer with a 1.1 eV gap. However, although an LED 614 is shown in FIG. 6, in some implementations, illumination can be provided by other illumination sources.

The processing apparatus 652 is communicatively coupled of the Kelvin force probe 612 (e.g., the PSD 634), and calculates the metal EWF based on the measurements obtained by the Kelvin force probe 612. For example, as described herein, the processing apparatus 652 can determine either an indicator for the metal EWF (e.g., a metric that indirectly provides information regarding the metal EWF) and/or the actual metal EWF. The processing apparatus 652 can also control the operation of one or more components of the system 600. For example, in some cases, the processing module controls the LED 614 (e.g., by transmitting command that switch the LED 614 on or off), the measurement chuck 610 (e.g., by controlling the movement of the movement chuck 610), the Kelvin force probe 612 (e.g., by controlling when the Kelvin force probe 612 obtains measurements and controlling the movement of the Kelvin force probe 612), and the visual detection system 628 (e.g., by identifying the location of features or markings, based at least in part on information obtained by the visual detection system).

Figure 7:
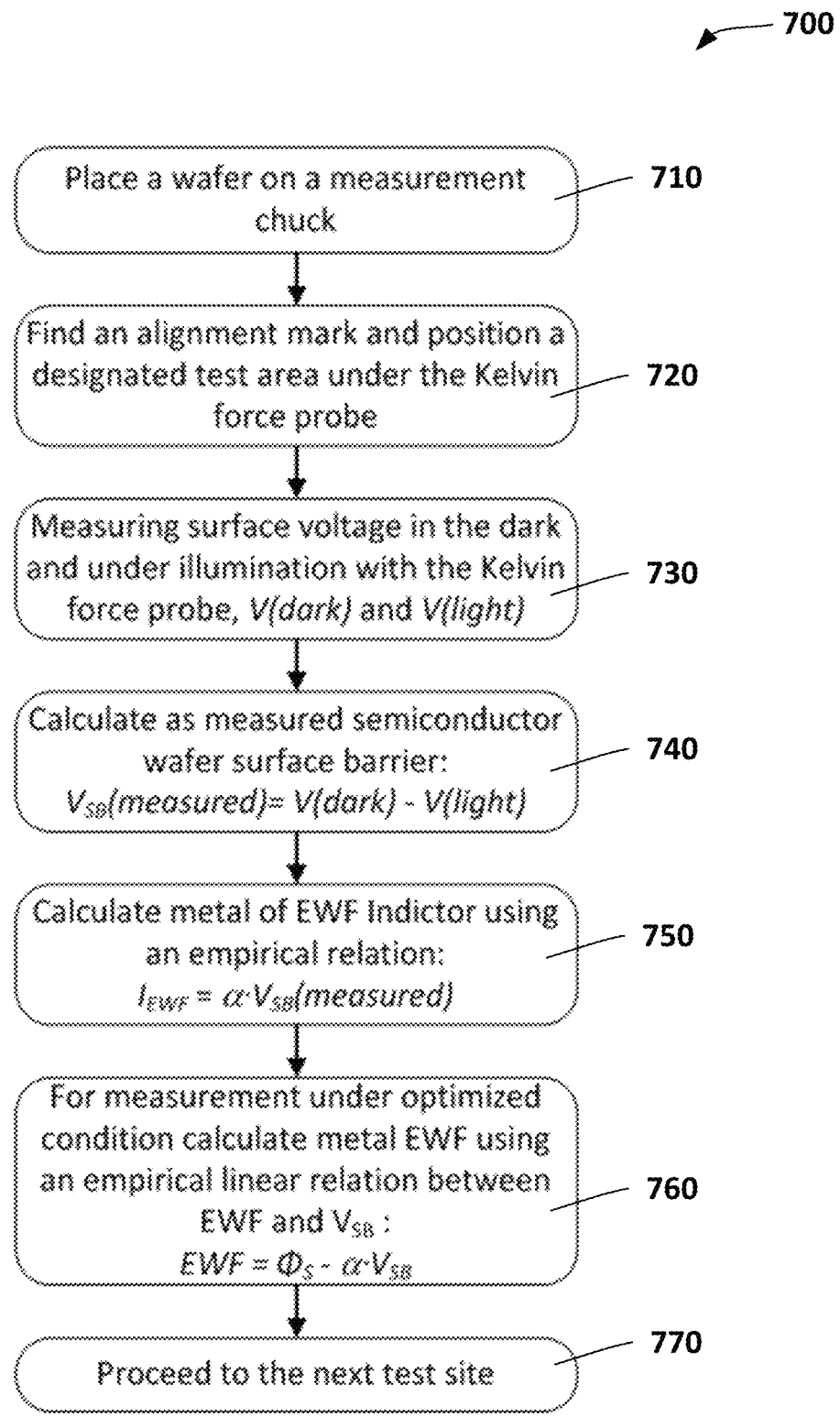
FIG. 7 shows an example process of mapping the metal EWF on miniature test sites of a pattern semiconductor wafer.

FIG. 7 shows an example process 700 of determining metal EWF on test sites of a pattern semiconductor wafer.

The process 700 begins by placing the wafer on a measurement chuck and positioning the wafer under the Kelvin force probe (step 710). For example, when using the system 600, a wafer is placed on the measurement chuck 610.

After the wafer is placed on the measurement chuck, the process 600 continues that finding an alignment mark and positioning a designated test site under the Kelvin force probe (step 720). For example, when using the system 600, the visual detection system 628 identifies an alignment mark or feature on a wafer, and uses this mark or feature to locate the designated test site.

Once the designated test site is located, a moveable stage can be used to position the designated test site under the Kelvin force probe.

After the designated test site is positioned under the Kelvin force probe, a first surface voltage of the designated test site is determined while the wafer is in the dark ($V_{DARK}$), and a second surface voltage of the designated test site is determined while the wafer is illuminated ($V_{LIGHT}$), (Step 720). For system 600, $V_{DARK}$ is determined using the Kelvin force probe 712 while the LED 614 is switched off, and $V_{LIGHT}$ is determined using the Kelvin force probe 612 while the LED 614 is switched on.

After $V_{DARK}$ and $V_{LIGHT}$ are measured, the measured semiconductor wafer surface barrier $V_{SB}$ is calculated (step 740). The surface barrier $V_{SB}$ is calculated from the difference between the two values $V_{DARK}$ and $V_{LIGHT}$ (e.g., $V_{SB}=V_{DARK}-V_{LIGHT}$).

After calculating the measured semiconductor wafer surface barrier $V_{SB}$, an indicator for the metal EWF of the wafer's test site is calculated (step 750). As described above, an indicator for the metal EWF of the wafer can be a value that relates either indirectly or directly to the metal EWF, and indirectly provides information regarding the metal EWF. As described above, in some cases, the indicator of the metal EWF can be expressed as $I_{EWF}=\alpha \cdot V_{SB}$, where $I_{EWF}$ is the indicator of the metal EWF and $\alpha$ is an empirical constant. In some cases, the empirical constant $\alpha$ is determined experimentally, for example by conducting experiments to compare the measured $V_{SB}$ for a test wafer against the measured $V_{FB}$ for the test wafer. As an example, the empirical constant $\alpha$ can be a constant of linear fit between $V_{SB}$ and $V_{FB}$. As noted above, in some implementations, the slope value of linear fit between $V_{FB}$ and $V_{SB}$ is equal to approximately −3.8. As another example, in the case of very thin dielectric, low interface charge, and monitoring on small test site, $\Delta V_{FB} \approx \Delta V_{SB}$. Other constants can also be used, depending on the implementation.

In some cases, determining the indicator of the wafer's $I_{EWF}$ includes determining measurements on multiple test sites present on the wafer and constructing contour map of the wafer's $I_{EWF}$ using the contour map of $V_{SB}$.

In some cases, the actual metal EWF is calculated for the wafer's test site (step 760). The actual metal EWF can be calculated either instead of or in addition to calculating the indicator of the metal EWF. In some cases, the metal EWF is calculated based on the relationship $EWF=\Phi_S-\alpha V_{SB}$, where EWF is the metal EWF of the wafer, $\alpha$ an empirically determined constant, and $\Phi_S$ is the semiconductor work function of the wafer.

In some cases, when calculating the metal EWF, the following relationship is used for $V_{SB}$: $V_{SB}=a\,(V_{dark}-V_{Light})+b$, where a and b are correction parameters. a and b can be determined empirically, for example by conducting experiments using a variety of measurement conditions and structures, and determining values for a and b that result in an accurate metal EWF under those experimental conditions.

After the indicator of the metal EWF and/or the metal EWF is determined, the process 700 continues by proceeding to the next test site on the wafer (step 770). For example, the visual detection system 628 can be used to locate another test site, and the moveable stage can translate and/or rotate the wafer so that the new test site is positioned under the Kelvin force probe. Process 700 can then be repeated for the new test site.

In some implementations, an optimum substrate type is selected to achieve sensitivity of the semiconductor surface barrier to metal process conditions. For the surface barrier based metrology, a surface barrier in depletion is sometimes a preferred condition.

Figure 8B:
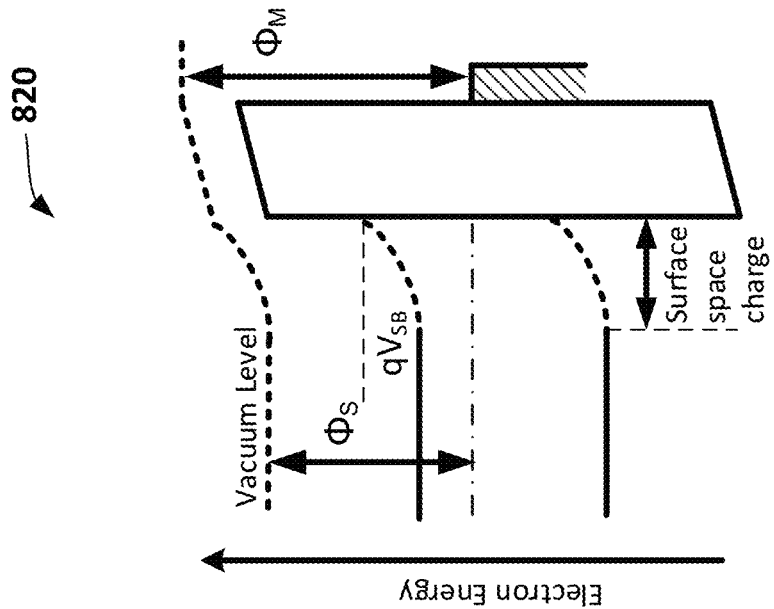
FIG. 8B shows an energy band diagram for a n-type semiconductor substrate and p-type metal.
Figure 8A:
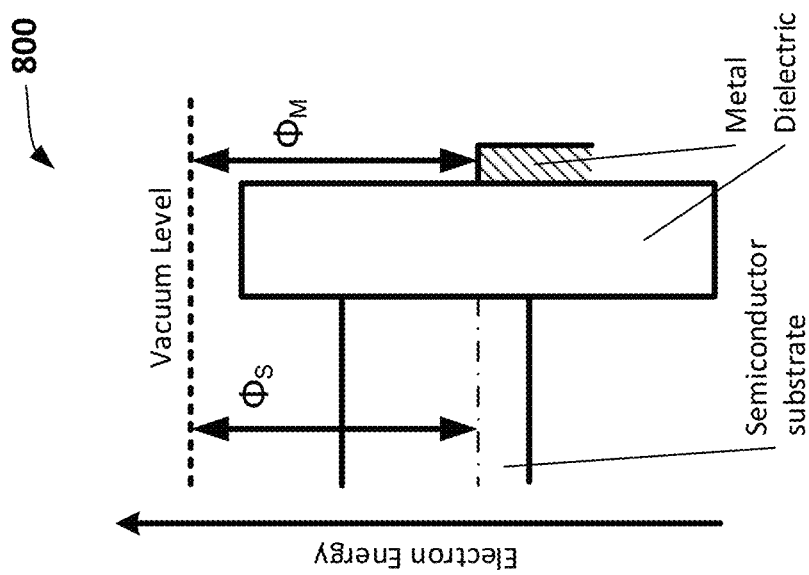
FIG. 8A shows an energy band diagram for a p-type semiconductor substrate and p-type metal.

For example, FIG. 8A shows an energy band diagram 800 of an example structure having a p-type substrate and p-type metal. In the example shown in FIG. 8A, $V_{SB}$ is ~0 V at equilibrium condition. Thus in such a case, $V_{SB}$ may not be sensitive to small variations in the metal deposition process.

FIG. 8B shows an energy band diagram 820 for an example MOS structure having an n-type silicon substrate and p-type metal at equilibrium. In the example shown in FIG. 8B, non-zero $V_{SB}$ is expected. Thus, in some implementations, an n-type substrate (e.g., as shown in FIG. 8B) may be preferred for p-type metal process monitoring.

Figure 8D:
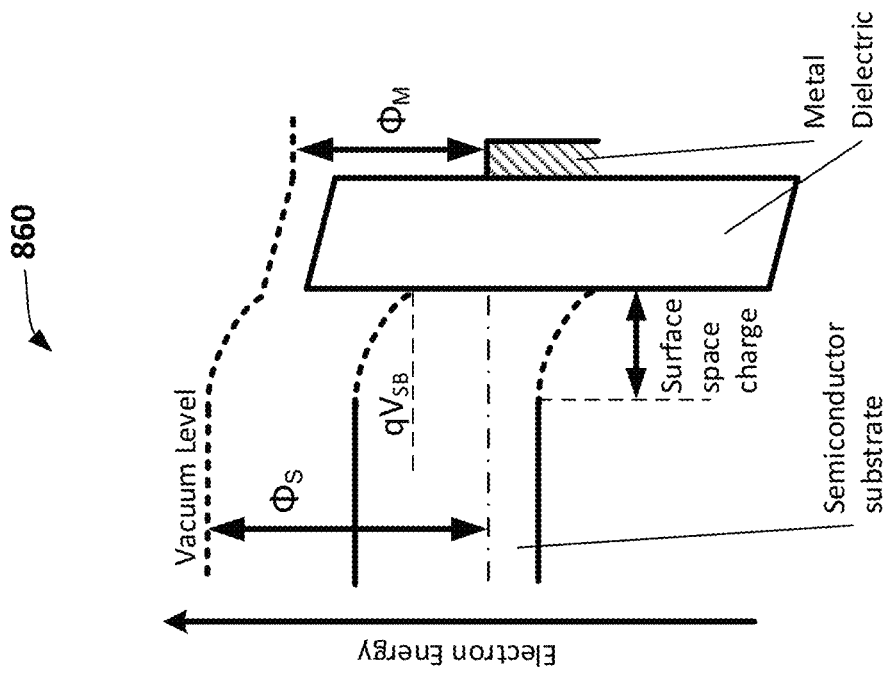
FIG. 8D an energy band diagram for a p-type semiconductor substrate and n-type metal.
Figure 8C:
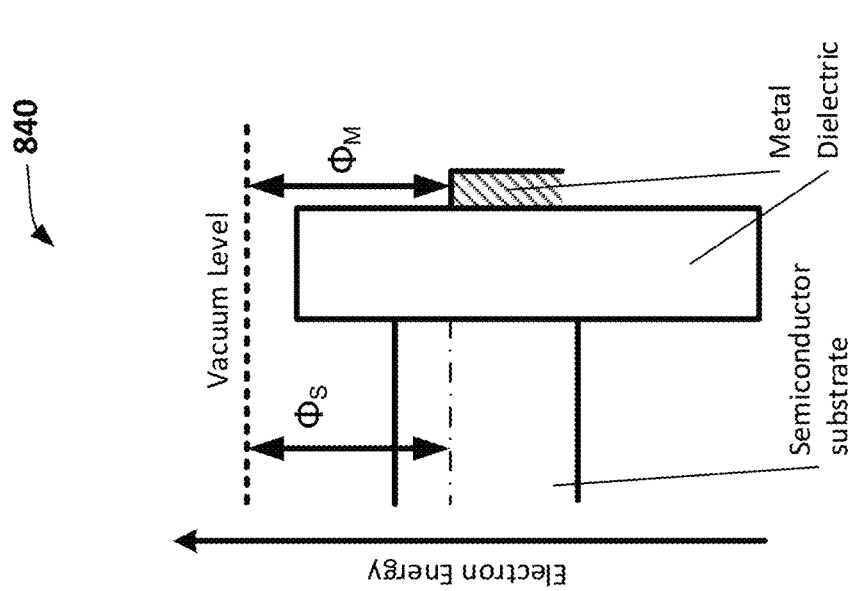
FIG. 8C shows an energy band diagram for a n-type semiconductor substrate and n-type metal.

FIG. 8C shows an energy band diagram 840 for an example structure having an n-type substrate and an n-type metal. Similar to the device having a p-type substrate and p-type metal shown in FIG. 8A, in this example, $V_{SB}$ is close to zero, and may not be sensitive to metal deposition conditions. Thus a p-type substrate can be used to monitor n-type metal. FIG. 8D shows an energy band diagram 860 for the equilibrium condition for this case. Thus, in some cases, p-type substrate might be preferred to monitor n-type metal deposition process.

In some implementations, an accumulation type surface barrier is not appropriate because it is not suitable for $V_{SB}$ determination using Kelvin-probe dark/light measurement. Accordingly, in some cases, the conditions leading to the creation of accumulation type surface space can be avoided. For example, this can include two cases: 1) large work function metal gate and p-type semiconductor substrate (e.g., $\Phi_{MS}>0$ for MOS with p-type substrate), and 2) small work function metal gate and n-type semiconductor substrate (e.g., $\Phi_{MS}<0$ for MOS with n-type substrate).

In some implementations, the thickness of the dielectric layer of a MOS structure is small enough that the metal induced voltage drop across the dielectric is relatively small. In some implementations, the thickness of the dielectric layer of a MOS structure films is sufficiently small that the metal induced voltage drop across the dielectric can be disregarded when calculating the metal EWF. In some cases, the dielectric layer of a MOS structure is optimized to obtain low interface trap charge $Q_{it}$ at interface dielectric-semiconductor substrate, such as $Q_{it}$ in the range of $1\cdot 10^{12}$, $1\cdot 10^{11}$, $1\cdot 10^{10}$ (q/cm$^2$), or less.

As described above, some implementations include measurement of the surface voltage in the dark and under illumination. The voltage measurements can be performed without contacting the measured surface of the wafer and without contaminating the wafer. Implementations allows accurate measurements on both blanket wafers (also referred to as monitor wafers) and patterned wafers (also referred to as production wafers). In the former case, dielectric films and metal cover the whole wafer, forming whole wafer MOS structure or a large area MOS with metal on a substantial part of the wafer surface. In the latter case the measurements can be performed on miniature test sites on the semiconductor wafer, where tests sites are 100 μm by 100 μm in size or smaller. The measured production wafer can be returned to the IC fabrication line for further processing. Some implementations allows mapping of the EWF distribution on the wafer for monitoring of process uniformity.

Some of the described implementations may be particularly important when monitoring EWF on wafers with metal covering the whole wafers (e.g., whole wafer MOS) because the $V_{FB}$ measurements are often not applicable to whole wafer MOS structure.

In some implementations, the surface barrier can be measured using a non-contact Kelvin probe technique, for example techniques that are based on contact potential difference, $V_{CPD}$, measurements. For simplicity, we refer to $V_{CPD}$ as the surface voltage V. These measurements can be performed in the dark and under strong illumination. For measurements on blanket wafers with whole wafer MOS or large areas MOS structures, a Kelvin probe 0.5 to 2.0 mm in diameter can be used, while for measurements on pattern wafers, a Kelvin force microscopy technique can be used with a Kelvin force probe about 10 μm in diameter or less.

The surface barrier measurement is based on the difference between surface voltages measured in the dark and under strong illumination. The illumination can be of proper photon energy that is sufficiently large to generate excess carriers in the semiconductor, but small enough not to generate free carriers in the dielectric or carrier photoemission from the metal. For example, a green LED light with a wavelength of 0.55 μm can be used to provide illumination for a silicon semiconductor substrate.

When the metal film is transparent to the illumination, the illumination can be from the top side of the semiconductor wafer through the metal, for example as shown in FIG. 4 and FIG. 6. In some cases, this can impose a limitation of the metal film thickness, e.g., to about 10 nm or less in some implementations. For thicker films, illumination from the wafer back-side can be used with lower photon energy light capable of penetrating deep into the wafer but still generating free excess carriers in a semiconductor as needed to flatten he surface barrier.

When the metal film is opaque to the illumination, the illumination can be from the back side of the semiconductor wafer. In these implementations, the measurement chucks 410 or 610 can be arranged to allow light to be incident on the semiconductor wafer (e.g., by having a transparent measurement chuck or a measurement chucks with gaps to allow the passage of light).

In general, implementations of the aforementioned technique take advantage of a unique property of a semiconductor surface to adjust its Fermi level position in response to different work functions of the metal on dielectric in MOS configuration. This results in changes of the semiconductor surface barrier enabling its use as a parameter to monitor metal EWF. In general, the monitoring of the metal effective work function is based on a relationship that includes the semiconductor work function, $\Phi_S$, and the semiconductor surface barrier, $V_{SB}$. $\Phi_S$ can be calculated as $\Phi_S=\chi_S+(E_C-E_F)$ where $\chi_S$ is the electron affinity of the semiconductor and $E_C-E_F$ is the energy difference between the semiconductor conduction band edge energy $E_C$ and the Fermi energy $E_F$. $\chi_S$ is a semiconductor parameter. $E_C-E_F$ can be calculated for a given semiconductor doping using well-known relationships, as discussed above.

The differential evaluation of $V_{SB}$ from $V_{DARK}-V_{LIGHT}$ in the present disclosure is not sensitive to adsorption of polar molecules (water or organic) on the top metal surface, which can cause a shift of the absolute value of the surface voltage.

In some implementations, another advantage is that the measurement technique can be applied to MOS test structures without a limitation of the top metal layer (layers) thickness, provided that the sample is not optically opaque. As implementations of this technique does not require a physical contact to the metal layer, metal layers as thin as 10 Å can be separately deposited, and their impact on the semiconductor surface barrier change can be tested. Moreover, use of whole wafer MOS structure allows mapping of $V_{SB}$ over the entire wafer area with a resolution determined by the Kelvin probe size, and can provide fast data feedback and facilitate fast metal gate development cycle.

In some implementations, $V_{SB}$ is measured using a vibrating Kelvin probe measurement. However, implementations of the disclosed technique are not limited only to these measurements. Other techniques for $V_{SB}$ are also possible, depending on the implementation.

Some implementations of subject matter and operations described in this specification can be implemented using digital electronic circuitry, or in computer software, firmware, or hardware, including the structures disclosed in this specification and their structural equivalents, or in combinations of one or more of them. For example, in some implementations, portions of system 400 and 600 (e.g., the processing apparatuses 428 and 452) can be implemented using digital electronic circuitry, or in computer software, firmware, or hardware, or in combinations of one or more of them. In another example, process 500 and 700 can be implemented using digital electronic circuitry, or in computer software, firmware, or hardware, or in combinations of one or more of them.

Some implementations described in this specification can be implemented, at least in part, as one or more groups or modules of digital electronic circuitry, computer software, firmware, or hardware, or in combinations of one or more of them. Although different modules can be used, each module need not be distinct, and multiple modules can be implemented on the same digital electronic circuitry, computer software, firmware, or hardware, or combination thereof.

Some implementations described in this specification can be implemented as one or more computer programs, i.e., one or more modules of computer program instructions, encoded on computer storage medium for execution by, or to control the operation of, data processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The term "processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer may also include, or be operatively coupled to receive data from or transfer data to, or both, one or more mass storage devices for storing data, e.g., magnetic, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. The processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A computer system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other.

Figure 9:
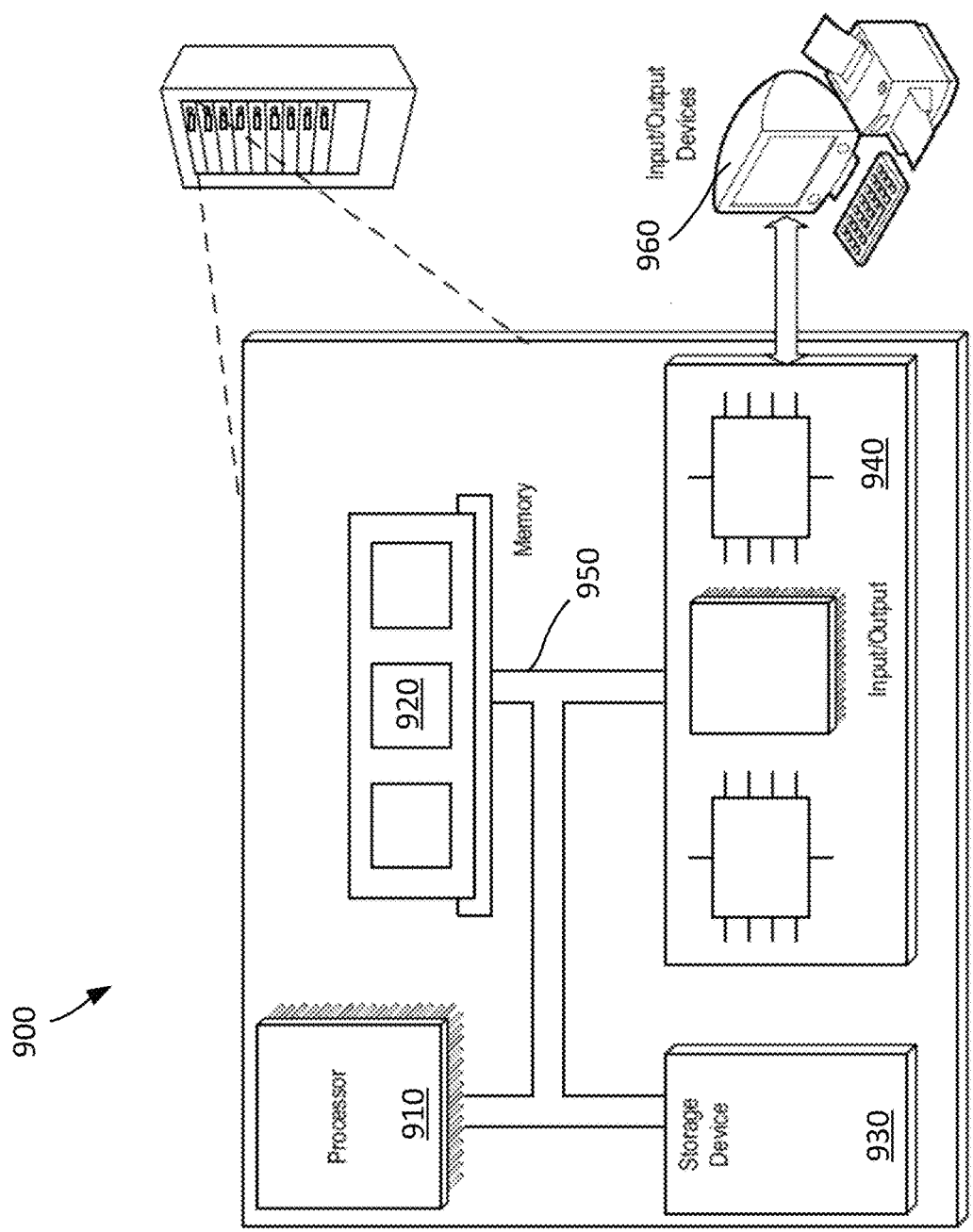
FIG. 9 shows an example computer system.

FIG. 9 shows an example computer system 900 that includes a processor 910, a memory 920, a storage device 930 and an input/output device 940. Each of the components 910, 920, 930 and 940 can be interconnected, for example, by a system bus 950. The processor 910 is capable of processing instructions for execution within the system 900. In some implementations, the processor 910 is a single-threaded processor, a multi-threaded processor, or another type of processor. The processor 910 is capable of processing instructions stored in the memory 920 or on the storage device 930. The memory 920 and the storage device 930 can store information within the system 900.

The input/output device 940 provides input/output operations for the system 900. In some implementations, the input/output device 940 can include one or more of a network interface devices, e.g., an Ethernet card, a serial communication device, e.g., an RS-232 port, and/or a wireless interface device, e.g., an 802.11 card, a 3G wireless modem, a 4G wireless modem, etc. In some implementations, the input/output device can include driver devices configured to receive input data and send output data to other input/output devices, e.g., keyboard, printer and display devices 960. In some implementations, mobile computing devices, mobile communication devices, and other devices can be used.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of implementations have been described. Nevertheless, it will be understood that various modifications may be made without departing from the spirit and scope of the invention. Accordingly, other implementations are within the scope of the following claims.

What is claimed is:

1. A method of determining an effective work function of a metal on a dielectric on a semiconductor wafer, the method comprising:
    measuring a surface voltage of the metal using a probe;
    determining a surface barrier voltage of the semiconductor wafer from the measured surface voltage of the metal; and
    determining the effective work function of the metal on the dielectric on the semiconductor wafer based, at least in part, on the surface barrier voltage.

2. The method of claim 1, wherein measuring the surface voltage comprises:
    measuring a first surface voltage of the metal while the metal is illuminated; and
    measuring a second surface voltage of the metal while the metal is not illuminated.

3. The method of claim 2, wherein the surface barrier voltage corresponds to the second surface voltage minus the first surface voltage.

4. The method of claim 2, wherein the first and second surface voltages are measured using a Kelvin probe.

5. The method of claim 2, wherein the first and second surface voltages are measured using a capacitor probe.

6. The method of claim 2, wherein measuring a first surface voltage of the metal while the metal is illuminated comprises:
    illuminating the metal with photon energy larger than an energy gap of the semiconductor wafer.

7. The method of claim 2, wherein the metal is transparent to the illumination, and wherein measuring a first surface voltage of the metal while the metal is illuminated comprises directing illumination upon the metal.

8. The method of claim 2, wherein the metal is opaque to the illumination, and
wherein measuring a first surface voltage of the metal while the metal is illuminated comprises directing illumination upon the semiconductor wafer.

9. The method of claim 1, wherein the surface barrier voltage is proportional to the effective work function of the metal on the dielectric on the semiconductor wafer.

10. The method of claim 1, wherein the effective work function of metal on the dielectric on the semiconductor wafer is determined, based at least in part, on a bulk work function of the semiconductor wafer.

11. The method of claim 10, wherein the effective work function of metal on the dielectric on the semiconductor wafer is determined using the relationship $EWF = \Phi_S - qV_{SB}$, where EWF is the effective work function of metal on the dielectric on the semiconductor wafer, $\Phi_S$ is the bulk work function of the semiconductor wafer, $V_{SB}$ is the surface barrier voltage of the semiconductor wafer, and q is a charge of an electron.

12. The method of claim 11, wherein determining the surface barrier voltage of the semiconductor wafer comprises determining a spatially dependent map of the surface barrier voltage along a surface of the semiconductor wafer; and
wherein determining the effective work function of the metal on the dielectric on the semiconductor wafer is based, at least in part, on the spatially dependent map.

13. The method of claim 1, wherein the effective work function of the metal on the dielectric on the semiconductor wafer corresponds to a work function value of the metal at an interface between the metal and the dielectric.

14. A system comprising:
a probe for measuring a surface barrier voltage of a semiconductor wafer, wherein a dielectric disposed on the semiconductor wafer and metal is disposed on the dielectric;
one or more processors in communication with the probe; and
non-transitory memory in communication with the one or more processors, the non-transitory memory storing instructions, which, when executed by the one or more processors, causes the one or more processors to determine an effective work function of the metal on the dielectric on the semiconductor wafer based, at least in part, on the measured surface barrier voltage.

15. The system of claim 14, wherein the effective work function of the metal on the dielectric on the semiconductor wafer corresponds to a work function value of the metal at an interface between the metal and the dielectric.

* * * * *